(12) United States Patent
Hou et al.

(10) Patent No.: US 7,701,288 B2
(45) Date of Patent: Apr. 20, 2010

(54) VARIABLE GAIN AMPLIFIERS

(75) Inventors: Chun-Chih Hou, Tainan County (TW); Wei-Hsuan Tu, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 7 days.

(21) Appl. No.: 11/869,779

(22) Filed: Oct. 10, 2007

(65) Prior Publication Data

US 2008/0088374 A1 Apr. 17, 2008

Related U.S. Application Data

(60) Provisional application No. 60/829,305, filed on Oct. 13, 2006.

(51) Int. Cl.
*H03F 3/45* (2006.01)
(52) U.S. Cl. .................... 330/254; 330/283
(58) Field of Classification Search ............ 330/254, 330/283, 278; 327/359, 563
See application file for complete search history.

(56) References Cited

U.S. PATENT DOCUMENTS

| | | | |
|---|---|---|---|
| 6,316,997 B1 * | 11/2001 | Tammone, Jr. ............ | 330/254 |
| 6,734,722 B1 | 5/2004 | Hsu | |
| 6,744,320 B2 | 6/2004 | Nguyen et al. | |
| 7,034,606 B2 * | 4/2006 | Caresosa et al. ............ | 330/254 |
| 7,292,101 B2 * | 11/2007 | Kocaman et al. ............ | 330/254 |
| 7,378,908 B2 * | 5/2008 | Suh et al. ................... | 330/254 |

FOREIGN PATENT DOCUMENTS

CN 1527480 9/2004

OTHER PUBLICATIONS

English abstract of CN1527480, Sep. 8, 2004.

* cited by examiner

*Primary Examiner*—Khanh V Nguyen
(74) *Attorney, Agent, or Firm*—Thomas, Kayden, Horstemeyer & Risley

(57) ABSTRACT

Variable gain amplifiers with wider linear range are provided, in which first and second loads are coupled to a power voltage, and a transconductor cell comprises first and second transistors, a gain control transistor, and first and second current sources. The first and second transistors comprise control terminals receiving a set of input signals, first terminals coupled to the first and second loads respectively, and second terminal coupled to first and second nodes respectively. The first and second current sources are coupled between the first node and a first voltage and between the second node and the first voltage respectively. The first gain control transistor is coupled between the first node and second node, receiving a gain control voltage, in which the grain control transistor has a threshold voltage lower than that of the first and second transistors.

21 Claims, 7 Drawing Sheets

VARIABLE GAIN AMPLIFIERS

CROSS REFERENCE TO RELATED APPLICATIONS

This application claims the benefit of U.S. Provisional Application No. 60/829,305, filed Oct. 13, 2006, and entitled "High Linear Range VGA".

BACKGROUND OF THE INVENTION

1. Field of the Invention

The invention relates to variable gain amplifiers and in particular to variable gain amplifiers with a wider linear range.

2. Description of the Related Art

In communications systems, analog receivers vary the amount of gain according to the specific receiver operation and the strength of the received signal, to maintain a constant signal level. Variable gain amplifiers are typically used to achieve this desired effect in the receiver. Because of the wide range of received signal strength, the variable gain amplifier must be able to vary its gain over a wide range.

BRIEF SUMMARY OF THE INVENTION

A detailed description is given in the following embodiments with reference to the accompanying drawings.

Embodiments of variable gain amplifiers are provided, in which first and second loads are coupled to a power voltage, and a transconductor cell comprises first and second transistors, a gain control transistor and first and second current sources. The first and second transistors comprise control terminals receiving a set of input signals, first terminals coupled to the first and second loads respectively and second terminals coupled to first and second nodes respectively. The first and second current sources are coupled between the first node and a first voltage and between the second node and the first voltage respectively. The first gain control transistor is coupled between the first node and second node, receiving a gain control voltage, in which the grain control transistor has a threshold voltage lower than that of the first and second transistors.

In another embodiment of a variable gain amplifier, a transconductor cell outputs a differential signal according to a set of input signals, and comprises first and second transistors coupled between the first load and a first node and between the second load and a second node respectively, and a first gain control transistor coupled between the first node and second node. The first gain control transistor has a gate oxide layer thinner than that of the first and second transistors, serving as a first degeneration resistor.

The invention further provides transconductor cells, in which first and second current sources are coupled between a first node and a ground voltage and between a second node and the ground voltage respectively. First and second MOS transistors comprise first terminals coupled to first and second loads respectively and second terminals coupled to first and second nodes respectively and converts a set of input signals to an output signal. A third MOS transistor is coupled between the first node and second node and controlled by a gain control voltage and has a threshold voltage lower than that of the first and second MOS transistors.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
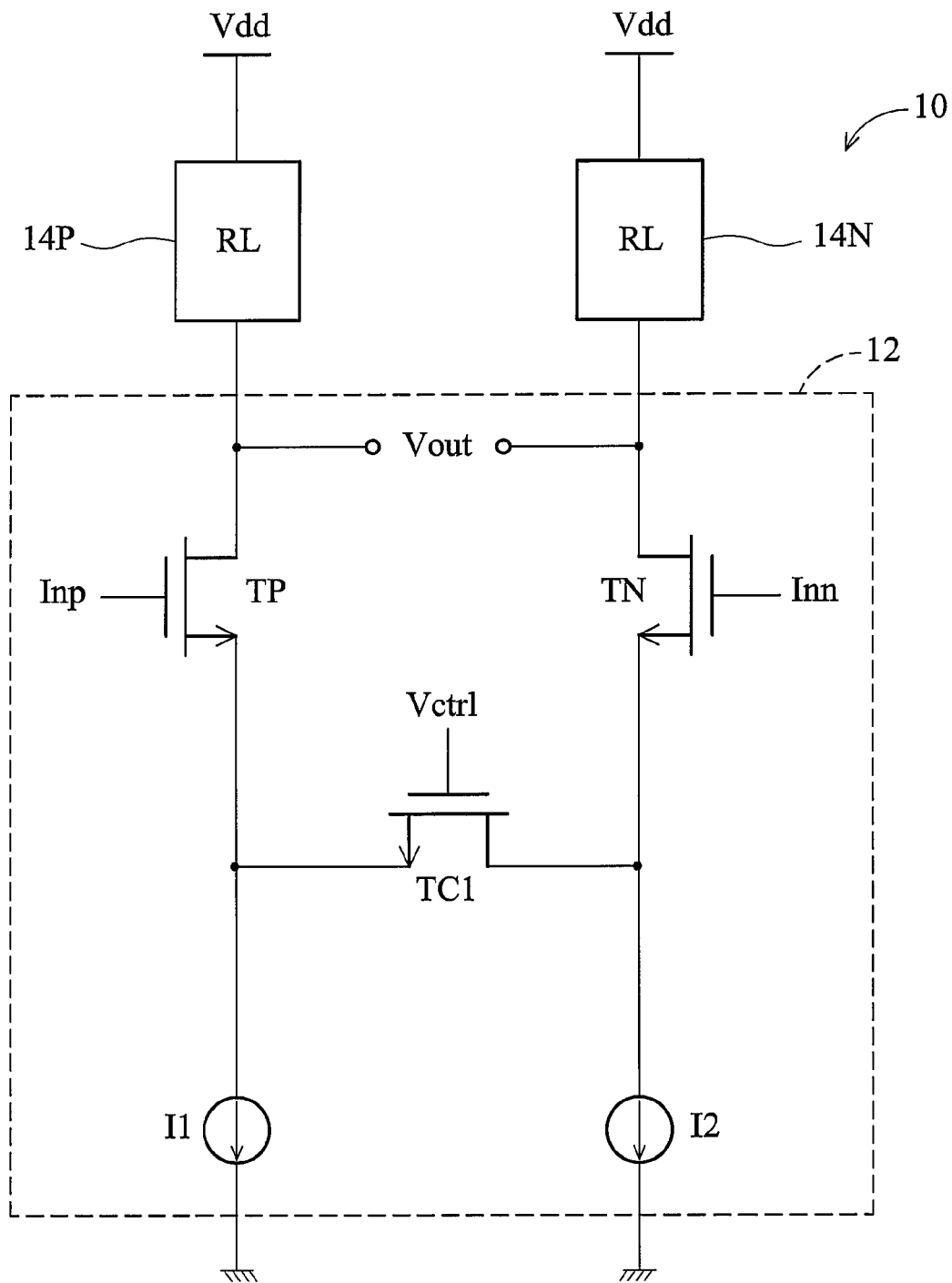
FIG. 1 shows an embodiment of a variable gain amplifier.

FIG. 1 shows an embodiment of a variable gain amplifier. As shown, a variable gain amplifier (VGA) 10 comprises a transconductor cell 12 and two loads 14P and 14N. The loads 14P and 14N can be resistive loads, inductive loads, capacitive loads, or active loads depending on design requirements. The transconductor cell 12 receives a set of input signals Inp and Inn and converts them to a differential signal, and the loads 14P and 14N converts the differential signal to an output voltage Vout. The transconductor cell 12 comprises three MOS transistors TP, TN and TC1 and two identical current sources I1 and I2, in which the MOS transistor TC1 serves as a degeneration resistor (or degeneration MOS) and controls gain of the VGA 10 according to the control voltage Vctrl. The three MOS transistors TP, TN and TC1 are identical, i.e., the three MOS transistors TP, TN and TC1 have the same threshold voltage and have gate oxide layer with the same thickness. Typically, gain of the VGA 10 can be controlled by adjusting the control voltage Vctrl, i.e., the gate voltage of the MOS transistor TC1.

Figure 2:
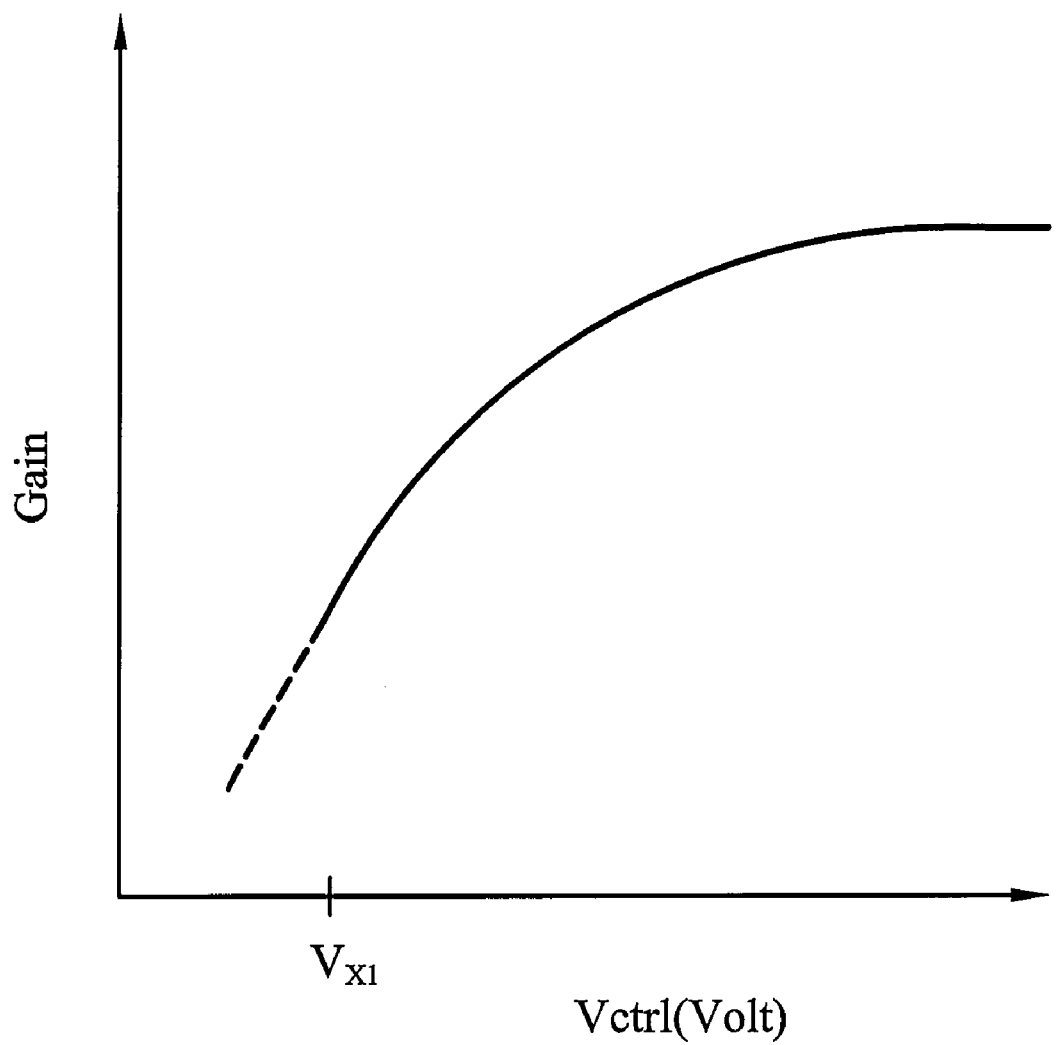
FIG. 2 shows a relationship between gain and control voltage of the VGA.

FIG. 2 shows a relationship between gain and control voltage of the VGA. As shown, there are upper and lower limits of the linear range of the VGA 10. For example, the control voltage Vctrl must be higher than the threshold voltage Vx1 of the MOS transistor TC1 such that the MOS transistor TC1 is turned on. As the control voltage Vctrl is too high, the slope of the gain of the VGA 10 is small. Namely, the linear range of the VGA 10 is limited.

Figure 3:
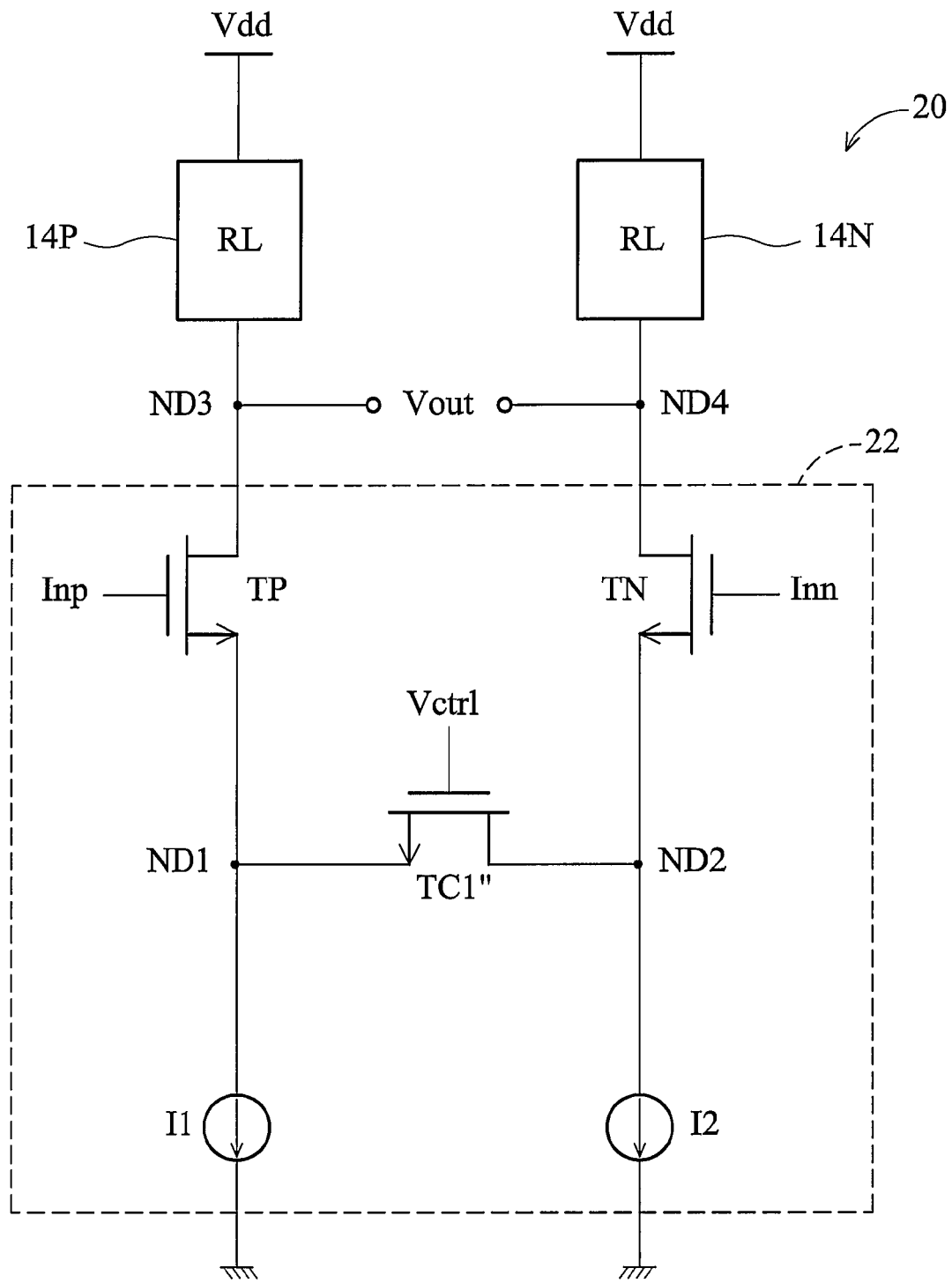
FIG. 3 shows another embodiment of a variable gain amplifier.

FIG. 3 shows another embodiment of a variable gain amplifier. As shown, the variable gain amplifier (VGA) 20 is similar to the VGA 10 shown in FIG. 1, differing only in the transconductor cell 22. Specially, the MOS transistors TP and TN are normal MOS transistors and identical, but the MOS transistor TC1" is a native MOS transistor or has a thinner gate oxide layer than the MOS transistors TP and TN. Namely, the threshold voltage of the MOS transistor TC1" is lower than that of the MOS transistors TP and TN.

The transconductor cell 22 receives input signals Inp and Inn and converts them to a differential signal, and the loads 14P and 14N then converts the differential signal to an output voltage Vout. The loads 14P and 14N can be resistive loads, inductive loads, capacitive loads, or active loads depending on design requirements. In the transconductor cell 22, the MOS transistor TP is coupled between the load 14P and the current source I1 and comprises a control terminal coupled to the input signal Inp. The MOS transistor TN is coupled between the load 14N and the current source I2 and comprises a control terminal coupled to the input signal Inn. The MOS transistor TP is identical to the MOS transistor TN, and the current sources I1 and I2 are identical.

The current sources I1 and I2 are coupled between the node ND1 and a ground voltage GND and between the node ND2 and the ground GND respectively, and the loads are coupled between a power voltage Vdd and the node ND3 and between the power voltage Vdd and the node ND4 respectively. In some examples, the loads 14N and 14P can be resistors, MOS transistors or a combination thereof.

For example, as the input signals Inp and Inn are high and low respectively, the MOS transistors TP and TN are turned on and off respectively, such that the voltage on the node ND3 is lower than the voltage on the node ND4 and thus, a differential signal is generated. Conversely, as the input signals Inp and Inn are low and high respectively, the MOS transistors TP and TN are turned off and on respectively, such that the voltage on the node ND3 is higher than the voltage on the node ND4 and thus, a differential signal, i.e., an output voltage Vout is generated between the nodes ND3 and ND4.

The MOS transistor TC1" is coupled between nodes ND1 and ND2 to serve as a degeneration resistor (also can be called degeneration MOS) and to control gain of the VGA 20 according to the control voltage Vctrl. The MOS transistor TC1" is, for example, a native MOS transistor rather than normal MOS transistors or has a gate oxide layer with a thickness thinner that in the MOS transistors TP and TN, such that the threshold voltage thereof is lower than that of the MOS transistors TP and TN. Gain of the VGA 20 can be controlled by adjusting the control voltage Vctrl, i.e., the gate voltage of the MOS transistor TC1".

Figure 4:
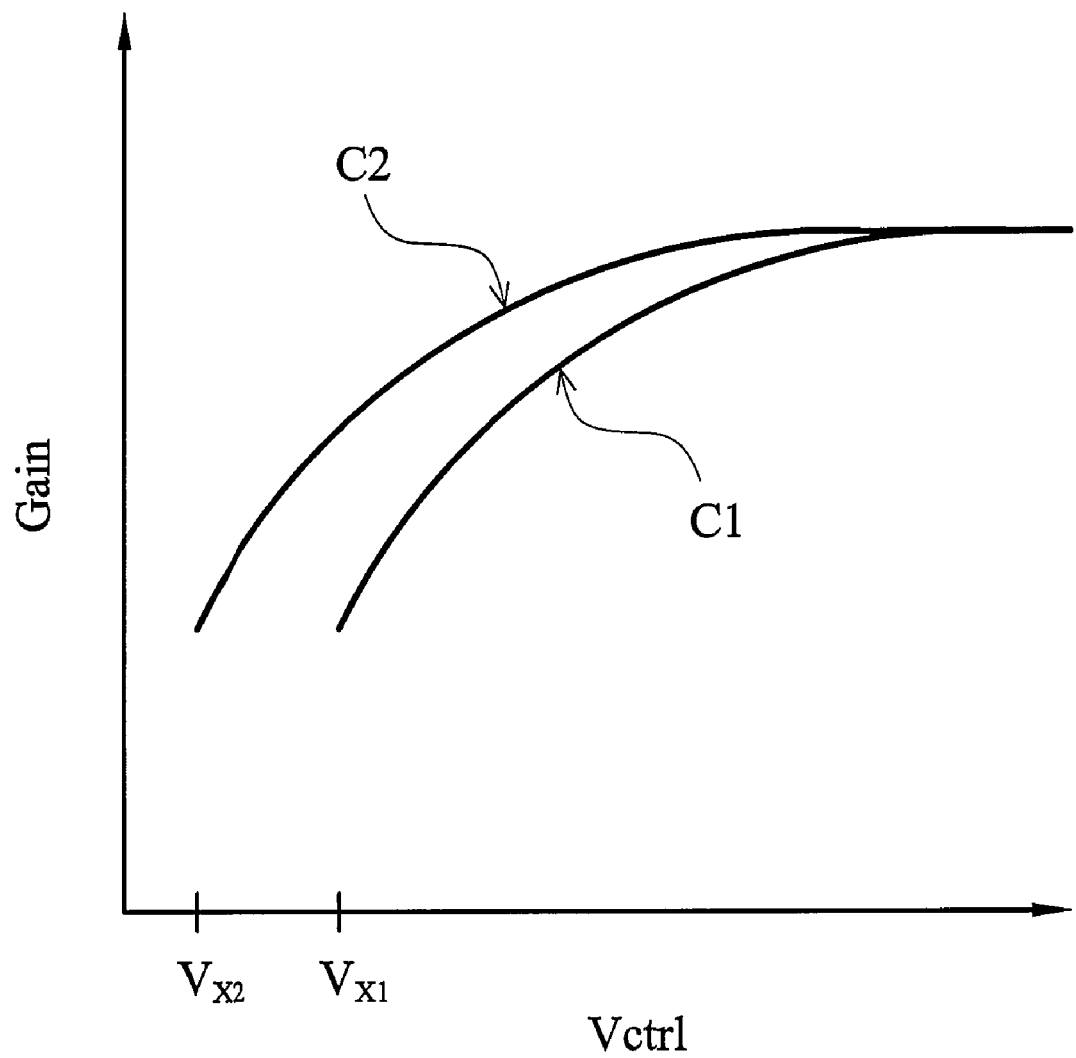
FIG. 4 shows relationships between gain and control voltage of the variable gain amplifiers in FIGS. 1 and 3.

FIG. 4 shows relationships between gain and control voltage of the variable gain amplifiers in FIGS. 1 and 3. As shown, curves C1 and C2 represent the relationship between gain and control voltage of the variable gain amplifiers 10 and 20 in FIGS. 1 and 3 respectively. Because the threshold voltage Vx2 of the MOS transistor TC1" (native MOS transistor) is lower than the threshold voltage Vx1 of the MOS transistor TC1 (normal MOS transistor), the MOS transistor TC1" can be turned on earlier than the transistor TC1 and the gain slope of the VGA 20 is not as deep as that of the VGA 10. Thus, the linear (controllable) range of the VGA 20 is wider than that of the VGA 10.

Figure 5:
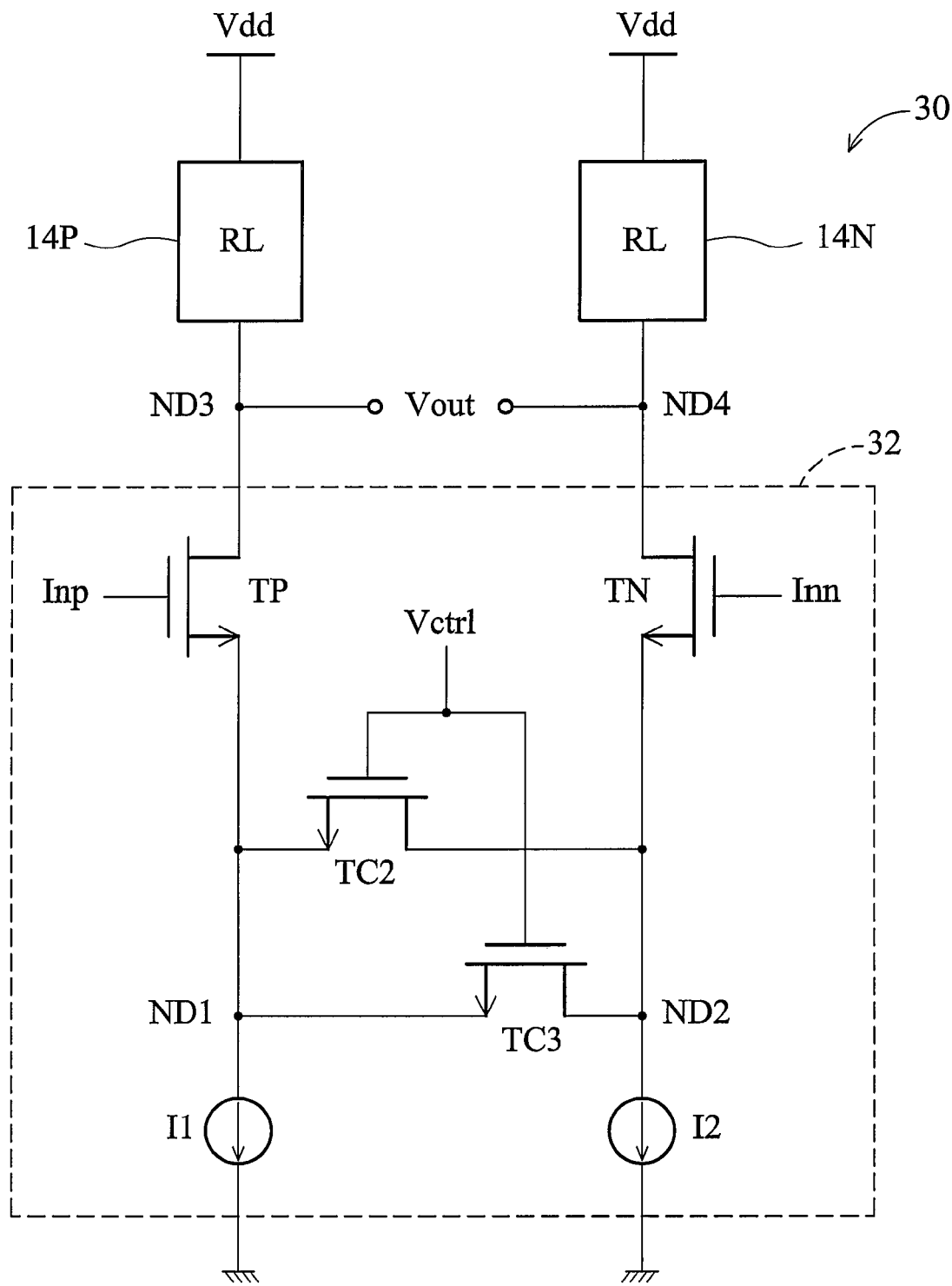
FIG. 5 shows another embodiment of a variable gain amplifier.

FIG. 5 shows another embodiment of a variable gain amplifier. As shown, the variable gain amplifier 30 is similar to the VGAs 10 and 20 shown in FIGS. 1 and 2, differing only in the transconductor cell 32. Specifically, the transconductor cell 32 has two MOS transistors TC2 and TC3 serving as first and second degeneration resistors (also referred to as degeneration MOS transistors). The MOS transistors TC2 and TC3 are coupled between the nodes ND1 and ND2 and are connected in parallel, and the MOS transistors TC2 and TC3 have different threshold voltages.

For example, the MOS transistor TC2 can be a native MOS transistor and the MOS transistor TC3 can be a normal MOS transistor as like as the MOS transistors TP, TN and TC1. Hence, the threshold voltage of the MOS transistor TC2 is lower than that of the MOS transistors TP, TN and TC3. In this embodiment, gain of the VGA 30 can be controlled by adjusting the control voltage Vctrl, i.e., the gate voltages of the MOS transistors TC2 and TC3.

Figure 6A:
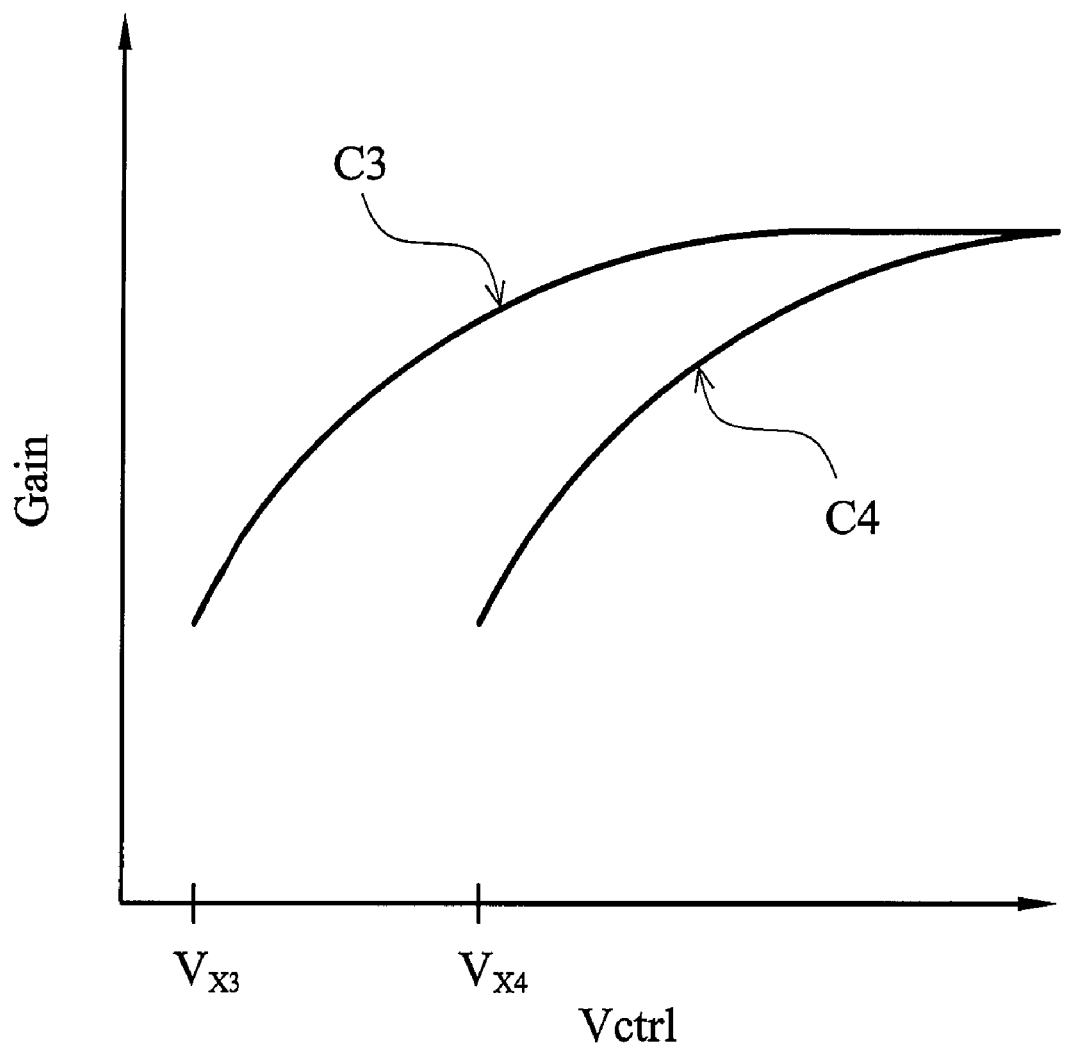
FIG. 6A shows a relationship between gain and control voltage of MOS transistors in FIG. 5.
Figure 6B:
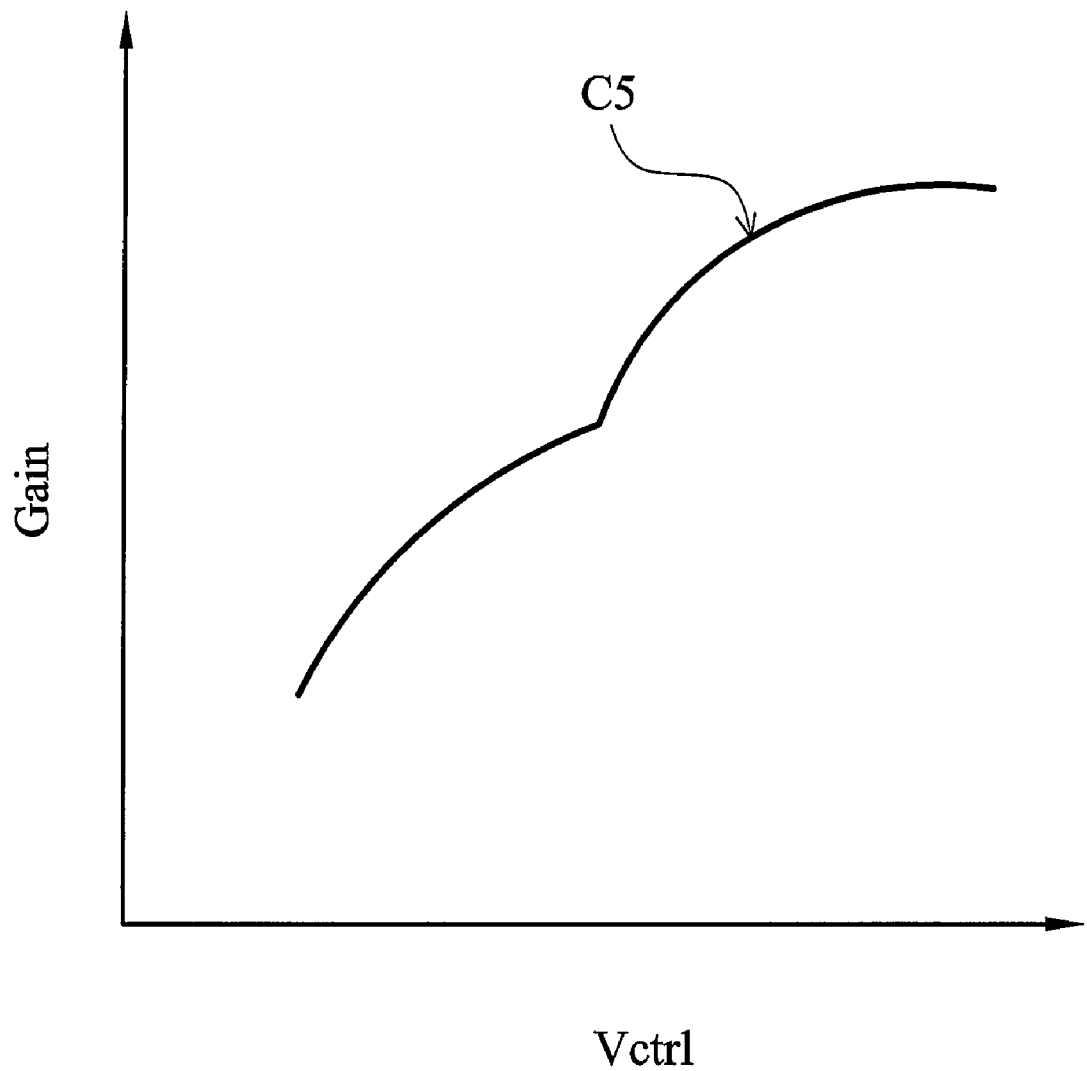
FIG. 6B shows a relationship between gain and control voltage of the variable gain amplifier in FIG. 5.

FIG. 6A shows a relationship between gain and control voltage of the MOS transistors in FIG. 5, and FIG. 6B shows a relationship between gain and control voltage of the VGA in FIG. 5. As shown, curves C3 and C4 represent the relationship between gain and control voltage of the MOS transistors TC2 and TC3, and curve C5 represents a relationship between gain and control voltage of the variable gain amplifier 30. For example, as the control voltage Vctrl exceeds the threshold voltage Vx3 of the (native) MOS transistor TC2, the MOS transistor TC2 is turned on for lower voltage gain control of the VGA 30, and when the control voltage Vctrl exceeds the threshold voltage Vx4 of the (normal) MOS transistor TC3, the MOS transistor TC3 is further turned on for higher voltage gain control of the VGA 30. Namely, the MOS transistor TC2 serves as a first degeneration resistor for lower voltage gain control and the MOS transistor TC3 serves a second degeneration resistor for higher voltage gain control, such that the linear range of the VGA 30 can be further extended, as shown in FIG. 6B.

In some examples of variable gain amplifiers, the transconductor cell can comprise a plurality of MOS transistors connected in parallel between the nodes ND1 and ND2, in which least one of the MOS transistors is a native MOS transistor, and the other can be normal MOS transistors with threshold voltages higher than those of the native MOS transistor.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A variable gain amplifier, comprising:
   first and second loads; and
   a transconductor cell, comprising:
      first and second transistors comprising control terminals receiving a set of input signals, first terminals coupled to the first and second loads respectively and second terminals coupled to first and second nodes respectively;
      first and second current sources coupled between the first node and a first voltage and between the second node and the first voltage respectively; and
      a first gain control transistor coupled between the first node and second node, receiving a gain control voltage, in which the gain control transistor has a threshold voltage lower than that of the first and second transistors.

2. The variable gain amplifier as claimed in claim 1, wherein the first and second transistors and the first gain control transistor are MOS transistors.

3. The variable gain amplifier as claimed in claim 2, wherein the first gain control transistor is a native MOS transistor.

4. The variable gain amplifier as claimed in claim 2, wherein a gate oxide layer of the first gain control transistor is thinner than that of the first and the second transistors.

5. The variable gain amplifier as claimed in claim 1, further comprising a second gain control transistor comprising a first terminal coupled to the first node, a second terminal coupled to the second node, and a control terminal coupled to the gain control voltage, in which the first and second gain control transistors have different threshold voltages.

6. The variable gain amplifier as claimed in claim 5, wherein the first and second transistors and the first and second gain control transistors are MOS transistors.

7. The variable gain amplifier as claimed in claim 6, wherein the first gain control transistor is a native MOS transistor.

8. The variable gain amplifier as claimed in claim 6, wherein the threshold voltage of the second gain control transistor exceeds that of the first gain control transistor.

9. The variable gain amplifier as claimed in claim 6, wherein the threshold voltage of the second gain control transistor is identical to that of the first and second transistors.

10. A variable gain amplifier, comprising:
a transconductor cell, outputting a differential signal according to a set of input signals, the transconductor cell comprising:
first and second MOS transistors coupled between a first load and a first node and between a second load and a second node respectively; and
a third MOS transistor coupled between the first node and second node, serving as a first degeneration resistor and having a gate oxide layer thinner than that of the first and second MOS transistors.

11. The variable gain amplifier as claimed in claim 10, wherein the third MOS transistor is a native MOS transistor.

12. The variable gain amplifier as claimed in claim 10, wherein the third MOS transistor has a threshold voltage lower than that of the first and second MOS transistors.

13. The variable gain amplifier as claimed in claim 10, further comprising a fourth MOS transistor coupled between the first node and the second node, serving as a second degeneration resistor, in which the fourth MOS transistor has a gate oxide layer with a thickness different from that of the third MOS transistor.

14. The variable gain amplifier as claimed in claim 13, wherein the third MOS transistor is a native MOS transistor.

15. The variable gain amplifier as claimed in claim 13, wherein the thickness of the gate oxide layer in the fourth MOS transistor exceeds that in the third MOS transistor.

16. The variable gain amplifier as claimed in claim 13, wherein the thickness of the fourth transistor is identical to that in the first and second MOS transistors.

17. The variable gain amplifier as claimed in claim 16, wherein the third MOS transistor has a threshold voltage lower than that of the first, second and fourth MOS transistors.

18. A transconductor cell, comprising:
first and second current sources coupled between a first node and a ground voltage and between a second node and the ground voltage respectively;
first and second MOS transistors comprising first terminals coupled to first and second loads respectively and second terminals coupled to first and second nodes respectively, the first and second MOS transistors converting a set of input signals to a differential signal; and
a third MOS transistor coupled between the first node and second node and controlled by a gain control voltage, the third MOS transistor having a threshold voltage lower than that of the first and second MOS transistors.

19. The variable gain amplifier as claimed in claim 18, further comprising a fourth MOS transistor comprising a first terminal coupled to the first node, a second terminal coupled to the second node, and a control terminal coupled to the gain control voltage, in which the third and the fourth MOS transistors have different threshold voltages.

20. The variable gain amplifier as claimed in claim 19, wherein the threshold voltage of the fourth MOS transistor exceeds that of the third MOS transistor.

21. The variable gain amplifier as claimed in claim 19, wherein the threshold voltage of the fourth MOS transistor is identical to that of the first and second MOS transistors.

* * * * *